(12) United States Patent
Seeley et al.

(10) Patent No.: US 7,378,942 B2
(45) Date of Patent: May 27, 2008

(54) METHOD OF DESIGNING, INSTALLING, AND OPERATING A FIRE ALARM OR SECURITY SYSTEM

(75) Inventors: John E. Seeley, Jamison, PA (US); Mitchell Black, Malvern, PA (US)

(73) Assignee: Viking Electronics Services, LLC, Grand Rapids, MI (US)

( * ) Notice: Subject to any disclaimer, the term of this patent is extended or adjusted under 35 U.S.C. 154(b) by 220 days.

(21) Appl. No.: 11/260,343

(22) Filed: Oct. 27, 2005

(65) Prior Publication Data

US 2007/0096902 A1 May 3, 2007

(51) Int. Cl.
*G09F 25/00* (2006.01)

(52) U.S. Cl. ............ 340/286.01; 340/506; 340/286.02; 340/3.1; 340/825.36; 340/825.49

(58) Field of Classification Search ................ 340/506, 340/286.01, 286.02, 3.1, 825.36, 825.49
See application file for complete search history.

(56) References Cited

U.S. PATENT DOCUMENTS

| | | | |
|---|---|---|---|
| 4,644,478 A | | 2/1987 | Stephens et al. |
| 5,400,246 A | * | 3/1995 | Wilson et al. ................ 700/17 |
| 6,861,951 B2 | | 3/2005 | Reghetti |
| 6,970,078 B2 | | 11/2005 | Reghetti |
| 2002/0196155 A1 | | 12/2002 | McNulty, Jr. |
| 2004/0080407 A1 | | 4/2004 | Reghetti et al. |
| 2004/0080408 A1 | | 4/2004 | Reghetti et al. |
| 2004/0080409 A1 | | 4/2004 | Reghetti et al. |
| 2004/0080520 A1 | | 4/2004 | Reghetti et al. |
| 2004/0083080 A1 | | 4/2004 | Reghetti et al. |
| 2004/0083081 A1 | | 4/2004 | Reghetti et al. |
| 2004/0186739 A1 | | 9/2004 | Bolles et al. |
| 2005/0154566 A1 | | 7/2005 | Farrell et al. |

\* cited by examiner

*Primary Examiner*—Daryl C Pope
(74) *Attorney, Agent, or Firm*—Polster, Lieder, Woodruff & Luccehsi, L.C.

(57) ABSTRACT

A method of integrating tasks common to the design, installation, and operation of a fire alarm and security system in a facility. Tasks included in the process include the initial design of the system, and any subsequent changes thereto; monitoring of the bidding process by preparing system's requirement statements, review of RFQ's, providing cost estimates and pricing for equipment, wiring, installation, and other system costs, preparing the bid together with necessary compliance and exception statements. Once a bid is accepted, subsequent monitoring and inspection of the system set-up is also done. The result is a single point source for all of the steps involved in putting an alarm system in place. The method further includes use of a single database storing information developed at each stage of system design and installation to provide a logical reporting progression. This allows for remote configuration of the system, subsequent monitoring of system operation, and dissemination of pertinent information to end users as needed.

33 Claims, 6 Drawing Sheets

| | |
|---|---|
| Layer 7 | Device x,y,z coordinate |
| Layer 6 | Panel hook-up |
| Layer 5 | I/O Mapping |
| Layer 4 | ID Numbers and Zone/ Text |
| Layer 3 | ID Numbers |
| Layer 2 | Device Wiring |
| Layer 1 | Floor Plan and Device Layout |
| | Background |

Drawing Page

METHOD OF DESIGNING, INSTALLING, AND OPERATING A FIRE ALARM OR SECURITY SYSTEM

CROSS REFERENCE TO RELATED APPLICATIONS

None

STATEMENT REGARDING FEDERALLY SPONSORED RESEARCH OR DEVELOPMENT

N/A

BACKGROUND OF THE INVENTION

This invention relates to the design and installation of alarm systems including fire alarm and security systems in facilities such as office buildings, factories, and warehouses, and more particularly to a method of integrating the design and installation process from its initial stages through completion, and subsequent operation of the system.

There are several steps or stages involved in the design and installation of fire alarm and security systems. These typically include:

system design including the preparation of installation drawings and bills of material;
system bidding process;
installation of various types of sensors, control panel(s), and ancillary equipment for monitoring the sensors and managing the system;
programming the sensors and control panel control panel for system operation, reporting, auditing, and updating;
system test and acceptance;
on-going system operation including alarm reporting and upgrading.

It will be appreciated that current fire alarm and security control systems are complex. There are manifested in a myriad of configurations and are uniquely implemented based upon the particular demands imposed by the installation site; i.e., the type of facility and its use, requirements of a building's owners and management, federal and state laws and regulations, and local ordinances and restrictions. Other design factors include how much on-site programming is required to bring the system into operation, and the support, maintenance, and updating or upgrading necessary to keep the system functioning properly once it is in use. The result is a substantial investment in both time and money to design the layout of the system, identify the components incorporated in it and their operational requirements, determine the cost to install the system and bring it "on-line", and the on-going costs of day-to-day operation, maintenance, and support.

Manufacturers and suppliers of sensors, and control and ancillary equipment usually only provide training and technical support for the products they make and/or sell, making it necessary for dealers and installers to provide the other services required. Moreover, most manufacturers and installers are only concerned with initial sale of their product or service and do not focus on potential recurring revenues from the products and services they provide; i.e., those occurring after the system is up and operating. This is reflected in the system's design. Those skilled in the art will appreciate that current technologies provide a great potential for improving the information and quality of information needed to design, install, and operate of a system; and in particular, the information provided by the system. This means there is a substantial potential for additional income which will be generated by utilizing new technologies to provide this information in an accurate and timely manner.

As one example, a drawback with current systems is the use of separate databases one of which is maintained at the installation site of the system, and another of which is maintained at a monitoring site that is usually remote from the premises where the system is installed. Both databases should include the same information about the system, its layout, the location of each sensor in the system, and system operation. This information, and information about the building and its condition, is vital to responding authorities (fire, police, medical, hazardous materials (hazmat)) when an alarm occurs. Unfortunately, it is often found that the data maintained in the one database is inconsistent with that maintained in the other. In a typical situation, a sensor has failed and been replaced. In doing so, a different type sensor, or newer model of the original sensor has been installed in its place. Or, the system has been expanded with a new branch added to the system that required new sensors to be installed. In either instance, the address of the new sensor (used in polling the sensor and identifying the location of the sensor when it goes into alarm), and operational information concerning the sensor, has not been entered into all the databases. Most often, the replacement or addition is so recent that while one database has been updated, the other has not. When that sensor now goes into alarm, the monitoring station will not necessarily know which sensor went off, the location of the sensor, or why it went off. All of this is important to identify whether an alarm is false, and if not false, what information to provide responders.

Another problem occurring during the initial stage of system design is the significant number of changes which usually take place. As the building layout is developed, the floor plan is re-arranged, then re-arranged, then re-arranged again. Offices and work areas are moved about, or made larger or smaller. Areas requiring access control are added, deleted, or moved. Entrances, exits, and the locations of hazardous materials or repositories for important items such as corporate records, works of art, precious metals, etc. are shifted from one place to another. As these changes occur, so does the configuration of the alarm system. Sensors need to be moved from here to there, more sensors are added or subtracted, new types of sensors are incorporated into the system.

A number of things flow from these changes. One is the cost of components. As sensors, control panels, ancillary equipment is added or changed, so do component costs. Specialized sensors for particular monitoring functions will especially add to the cost. A system installer bidding on the project needs to know how of many items are being installed, what goes where, each components' operational requirements, and what type of cabling, connectors, fixtures, etc. will be needed since all of these impact his estimate and his bid. He must also factor in labor costs (installers, management and support personnel), and overhead and profit, in order to develop a realistic proposal to submit for the project. If changes are continually being made, and these are not timely provided to the contractor, his proposal will not be realistic causing him to lose the bid; or if it is awarded to him, subsequent disputes when he starts to go over budget or finds that he cannot complete the job within his bid. In either instance, problems will result that are unnecessary.

BRIEF SUMMARY OF THE INVENTION

The present invention is directed to a method or process which facilitates integration throughout all levels in the design, installation, and operating of an alarm or security system. In particular, the invention is directed to a method of integrating tasks common to the design, installation, and operation of an alarm or security system in a facility. These tasks include layout of the system in accordance with the facility's design and physical structure, including on-going changes to the layout. Completing the task involves identifying components as they are incorporated into the system, accessing appropriate databases to specify particular components by their manufacturer's part number; and, in doing so, the component's operational requirements, cost, and availability. In addition, as the system is laid out, if common components are required, they are automatically incorporated into the layout, and if a location address is required for that component, it is automatically entered in the system, and in a system database for reference during future system operations. If layout changes are made, the method facilitates automatic adjustment of the number, location, and address of components, and updating other databases as appropriate.

For a contractor installing the system, the method includes incorporating the system design into a database. The method further includes automatically developing bills of material (sensors and other equipment installed in the system, cables, connectors, etc.) required for the installation, calculating the cost of the materials and adjusting these costs as changes to the layout are made. All this information is automatically exported from the database to the contractor, or others, requiring information relevant to the system. Labor and overhead costs, and profit, are also automatically calculated if these values are changed as layout changes are made; so, when the final system design is completed, the contractor can provide a complete and accurate bid for the installation.

For a general contractor, the process includes monitoring of the bidding process by preparing system's requirements lists including necessary compliance requirements and exceptions, reviewing requests for quotes (RFQ's), and comparing bids submitted by different contractors, together with necessary compliance and exception statements. Once a bid is accepted, the method enables subsequent monitoring and inspection of the installation, as it is completed, making progress payments to the installer if required by contract, and comparing actual costs to budget to identify possible cost overruns.

The present invention further enables all of the information developed at one stage in the process to be available at all subsequent stages of design, installation, and operation. The result is a fully integrated process with information from any one stage subsequently available for use in operating the system, reconfiguring (locally and remotely) and upgrading the system, repairing and maintaining the system, and providing requisite information to responders in the event of an alarm.

Other objects and features will be in part apparent and in part pointed out hereinafter.

BRIEF DESCRIPTION OF THE SEVERAL VIEWS OF THE DRAWINGS

The objects of the invention are achieved as set forth in the illustrative embodiments shown in the drawings which form a part of the specification.

Corresponding reference characters indicate corresponding parts throughout the several views of the drawings.

DETAILED DESCRIPTION OF INVENTION

The following detailed description illustrates the invention by way of example and not by way of limitation. This description will clearly enable one skilled in the art to make and use the invention, and describes several embodiments, adaptations, variations, alternatives and uses of the invention, including what I presently believe is the best mode of carrying out the invention. As various changes could be made in the above constructions without departing from the scope of the invention, it is intended that all matter contained in the above description or shown in the accompanying drawings shall be interpreted as illustrative and not in a limiting sense.

Figure 1:
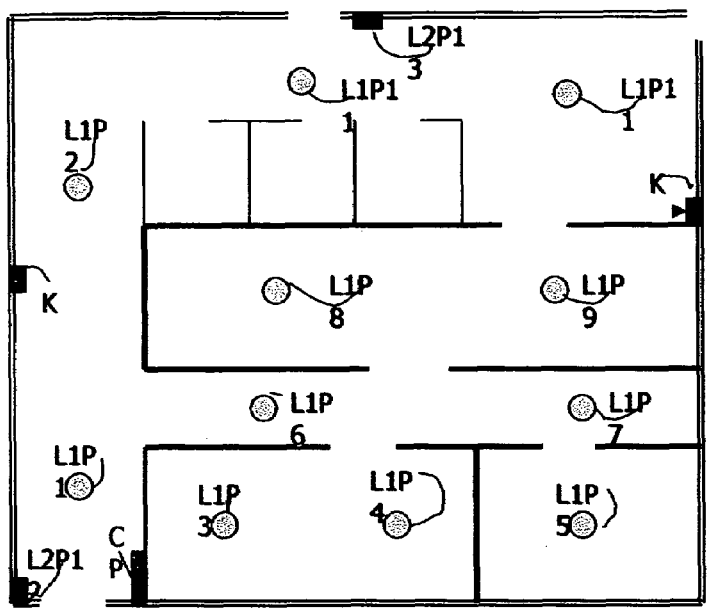
FIG. 1 illustrates a premises monitored by a fire alarm system designed, installed, and operated in accordance with the present invention.

In accordance with the method of the invention, a fire alarm or security system indicated generally 10 is installed in a building, or the floor of a building, as shown in FIG. 1. System 10 includes a series of sensors or alarm devices indicated generally L1P1-L2P15. There are typically analog devices, but digital devices are also readily incorporated into the system. The design, installation and operation of system 10 involves sensor and control panel manufacturers, installation contractors, monitoring services, and maintenance/repair companies. While some companies may provide more than one of these goods or services, none provides all of them. Given the complex nature of modern alarm and security systems, a substantial amount of information (data) is required and acquired throughout the various stages from designing the system, installing it, and then operating it. This data is useful first for designing, bidding, and installing the system; then programming and operating the system once installed, administering the system (including billing), monitoring the system for alarms and providing appropriate information to alarm responders, and data for system maintenance, repair, inspection, and upgrading. While certain information may be unique to a particular stage of the process, much of the information is common throughout. It is a feature of the present invention to incorporate all the information collected in various databases, or in different portions of one database, into a common database usable throughout the system during each stage of the process. While information in the resulting, common database is, in some respects, cumulative; because it needs to be entered only once, there is a tremendous cost savings in time and effort since data does not have to be recreated for use in succeeding stages, or for transferring information created for use at one stage of the process into a new database for use in a succeeding stage.

Figure 2:
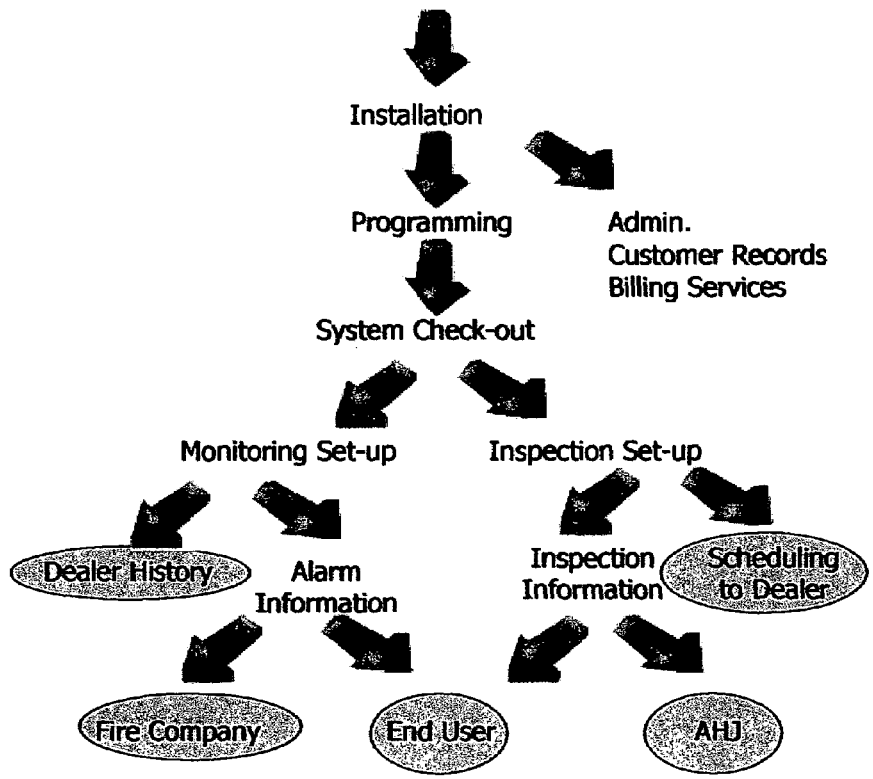
FIG. 2 is a flow chart illustrating information flow throughout the design, installation, and operation of an alarm system.

Information flow through the system is indicated in FIG. 2.

Figure 3:
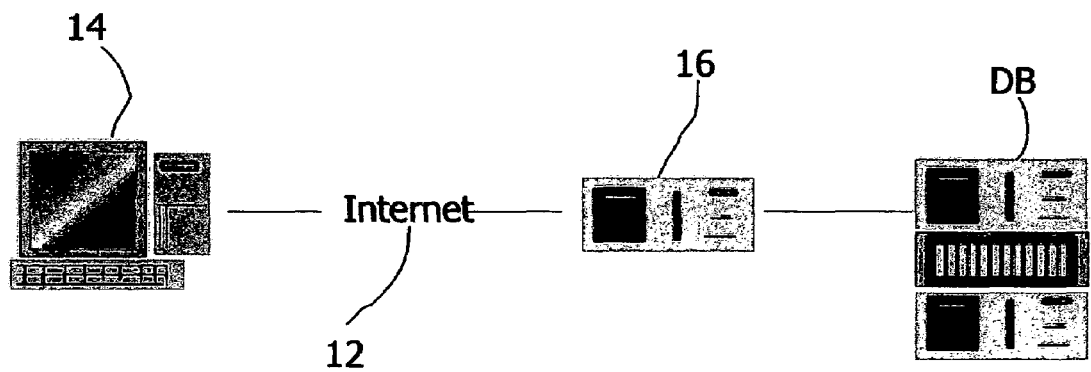
FIG. 3 is a simplified representation of a data flow path from a common database for the system to a user's site.

In utilizing system data, as shown in FIG. 3, a central database DB is created in which all information pertinent to the system is stored. Rather than being maintained on-site where the system is installed, or at the monitoring site, the database is maintained at a separate location where it is accessible by everyone involved with the system. This includes those responsible for monitoring the system, those responsible for its upkeep and maintenance, and fire departments or other authorities responding to alarms emanating from the system. The database is maintained by fees charged to those accessing data from the database, this data being automatically exported to those authorized to access information in the database. The advantage to these people, however, is that they are no longer required to establish and maintain a database for the installation as they do now. Access to the database is over a communication channel which can include the internet. Or, manufacturers, end users such as contractors, responders such fire departments, etc., can establish a virtual private network (VPN) for accessing the database. Data from database DB is transferred over a communications channel 12 (e.g., the internet) to a workstation 14, which can include a personal computer (PC), through an appropriate interface device 16.

As an example of the advantages of using a common database, in the bidding process, database DB is used to:
  provide centralized bidding programs for dealers/installers;
  provide an automated process for device selection, system power requirements, power supplies, battery and panel networks;
  bid assistance to dealers including help with system configuration, question and answer sessions, and proposal submittals;
  promote a bid response format, including standard exceptions, in a standard format (Microsoft Word®, for example); and,
  guarantee prices on quoted products for a stipulated period of time.

At an initial or design stage of the process, drawing information related to the floor plan of the building, layout of the system, sensor location, information for each sensor at each location, and zone/text information about the system is entered into database DB. Once system 10 is initially laid out, if changes are made to the building or floor in which the system is installed which affect the system's layout, or changes are made to the system, or both, this new information is also stored in the database. This is particularly important because, as the design of system 10 and its installation progresses, additional layers of information are now readily combined with the background information to provide additional data to a user (designer, installer, general contractor) without having to recreate all the data previously created. And, all of the data is now accessible from a single database.

Figures 4A, 4B:
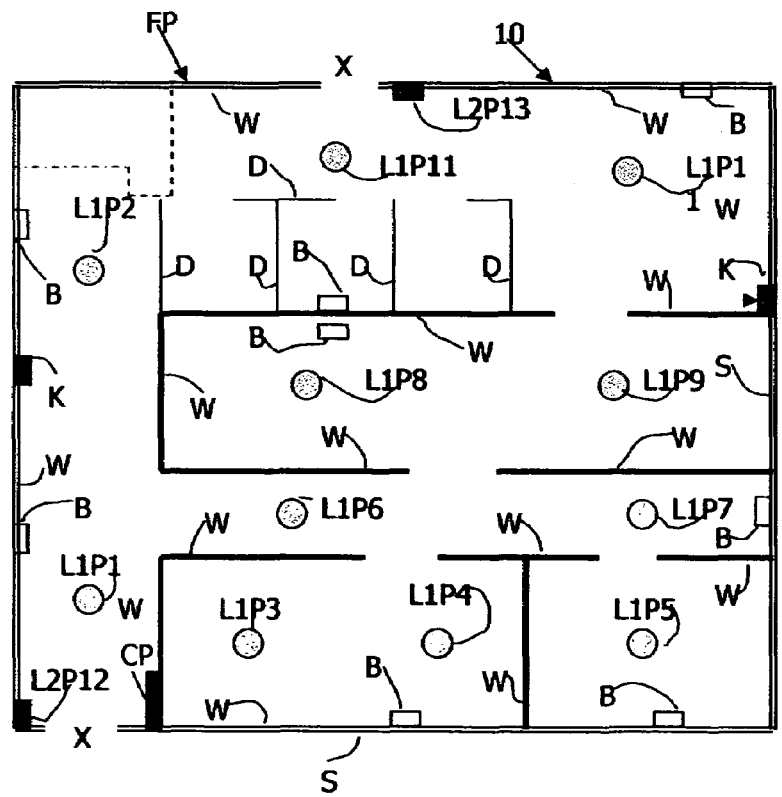
FIGS. 4A-4E illustrate the steps in the design and layout of a system.

FIG. 4A illustrates the steps involved in the design process to effect a layering of information pertinent to the system. In the following discussion, it will be understood that all of the layers are developed as computerized drawings of the system and the facility in which it is installed. The first information entered into the database is background information about the facility including such things as street address, location of nearest responders such as police, fire, and hospital.

Next, as shown in FIG. 4B, a first level (Layer 1) of additional information includes a floor plan FP of the facility. Floor plan FP, which may initially be a drawing, is scanned and converted into a computerized format. The floor plan will show the location of entrances and exits X to the facility, fixed walls or dividers W and movable walls or dividers D, windows S, electrical outlets E and panels P, duct work U, alarm devices (klaxons) K, etc. With this information, a system designer now knows the shape of rooms, the extent of hallways, the location of common areas and areas for specialized activities, and the routing of electrical and HVAC systems. Also included in this layer of information is the location of sensors P1-P13 with the facility. The respective prefixes L1 and L2 for these sensors indicate respective communication loops in which they are connected. All the devices with the prefix L1 are in one loop, and those with the prefix L2 are in another loop. Of the sensors, devices P1-P11 are, for example, smoke and fire detectors, while devices P12 and P13 are detectors sensing the opening and closing of the doors at the respective entrances and exits. The various types of sensing devices used for these purposes are known in the art, and are not described. In FIG. 4B, a control panel CP for the system is also shown.

During the layout of system 10, the method of the invention enables a number of design steps to be automatically performed. First, if it is known that the same type sensor is going to be repeatedly used, and that there is a uniform spacing between sensors, then, the placement of the first sensor results in automatic placement of additional sensors of the same type. Thus, in FIG. 4B, the placement of sensor L1P6 triggers automatic placement of sensors L1P7-L1P11. It will be understood by those skilled in the art that the system designer can override this feature and move the sensors to other locations. As each sensor is placed, identification and address information for that sensor is automatically assigned to it. If the layout is subsequently changed, placement of the sensors is automatically adjusted for the new configuration. This not only reduces design time, but also prevents errors in the layout and assignment of address information, for example, for the sensors.

Figure 4C:
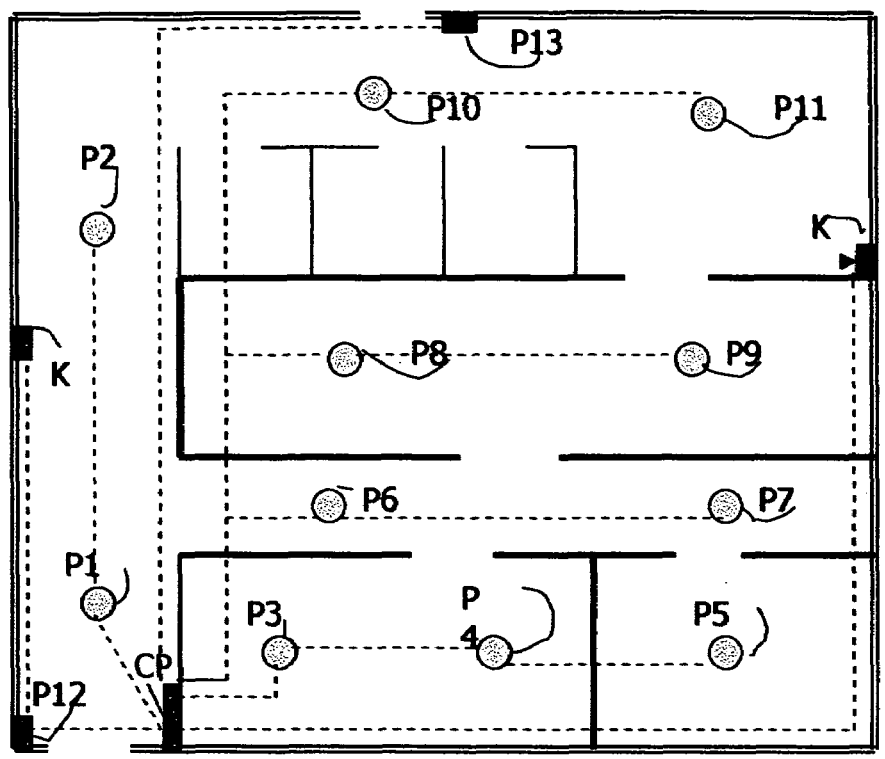

In FIG. 4C, a second level (Layer 2) of information now shows routing of wiring from control panel CP to each sensor and alarm device. For convenience the routing paths are indicated as dashed lines. As shown in FIG. 4C, some of the sensors may be wired in series (sensors P1-P2, sensors P3-P5, sensors P12-P13), and other in a parallel or series/parallel combination (P6-P7 with P8-P9, and with P10-P11). Those skilled in the art will understand that the routing shown in FIG. 4C is exemplary only, and that other routing configurations are possible.

Figure 4D:
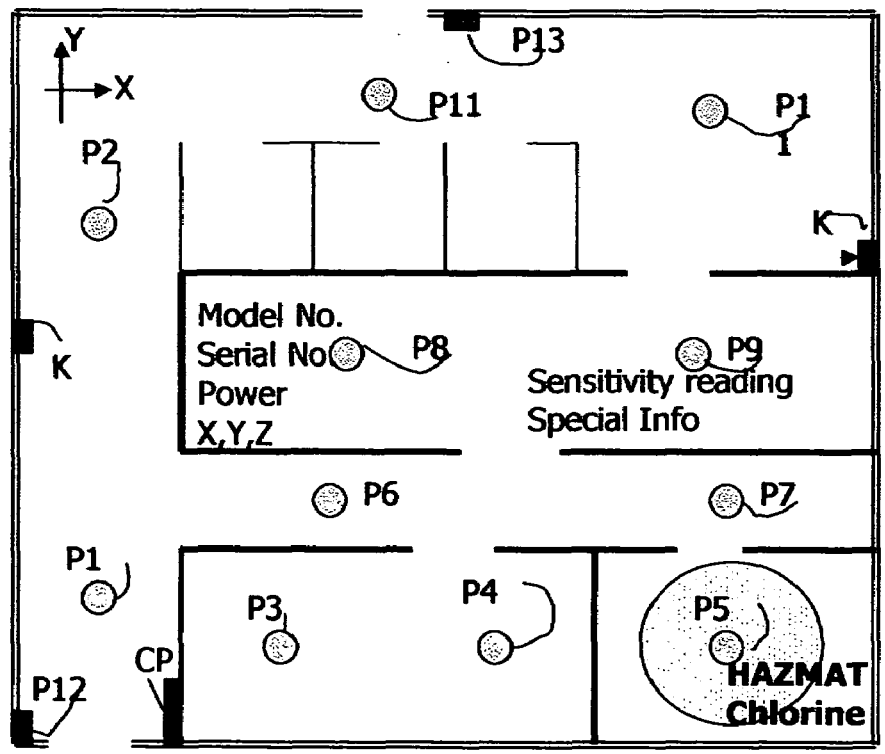
Figure 4:
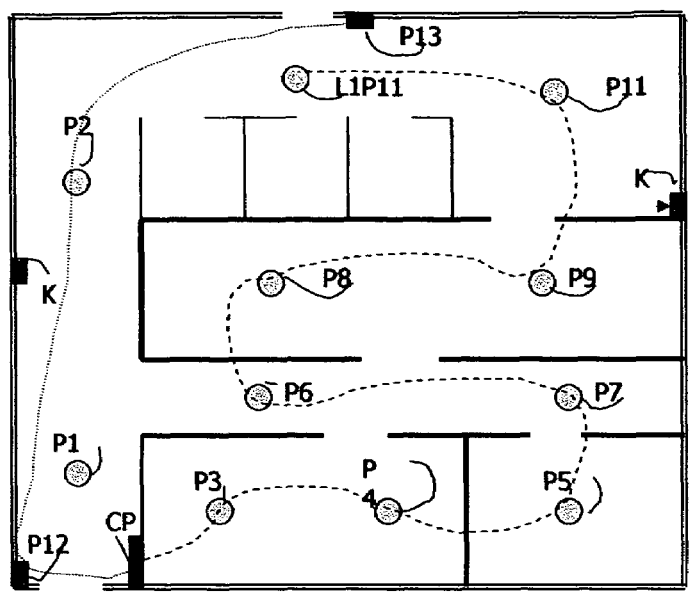

In FIG. 4D, a third level (Layer 3) of information includes device identification (ID) information. As shown for device P8 in the Fig., this information includes, for example, the manufacturer's name, model or part number, serial number, power requirements, threshold setting(s), and information related to the particular device such as when installed, last tested, etc. This information is separately "tagged" to each device even though many of the devices may be identical except for serial number. It will be appreciated that this information is further tabulated so an installation contractor, for example, in preparing his bid, can readily ascertain how many of each type component he will be installing.

As further shown in FIG. 4D, a next level (Layer 4) of information not only includes the device ID information, but also zone/text information. For example, the room (zone) in which sensor P5 is installed is used as a storeroom for hazardous materials. Accordingly, the device information for this sensor will include not only that hazardous materials are associated with that sensor, but also what type of hazardous material. This is important because when the system is in operation, if sensor P5 goes into alarm, the information transmitted to responders to the alarm will include not only the caution that the area they will be accessing includes hazardous materials, but also what type of material and the precautions (protective gear, etc.) they will need to take.

At the next level (Layer 5), input/output information for the system is incorporated into the database. This will include such matters as what reports are generated in the normal course of operation, as well as what happens when the system goes into alarm. In an alarm situation, the information entered into the database includes contact information for who gets notified, in what order they are notified (e.g., responders first, then facility management, then the insurance carrier), what information about the current alarm is each contact to be provided, what historical information about the facility and any previous alarms is to be provided, etc.

Referring to FIG. 4E, the next level (Layer 6) adds interconnections (hook-ups) from control panel CP to the various sensors in the system. These hook-ups comprise loop arrangements in which all the sensors in the same loop are polled together and provide status and alarm information to the control panel over a common communications link. In FIG. 4E, the sensors P1-P11 are shown to be connected in a common loop designated L1, while sensors P12, P13 are connected in a common loop L2. For convenience, loop L1 is shown as a dashed line in FIG. 4E, and loop L2 as a dotted line.

As is apparent from the drawing, loop L1 includes all of the same sensors of one type (e.g., a fire sensor) and Loop L2 all of the sensors of the same sensors of another type (e.g., door sensor). Those skilled in the art will appreciate that all of the same sensors do not have to be on the same loop, and that there could be two or more separate loops for the fire sensors, for example. Regardless, each loop originates and terminates at control panel CP. Further the control panel is, in turn, connected to database DB and provides information about the operational status of the system. When a periodic sensor status test is performed, the control panel provides information of each sensor's current status to the database. This allows a failing sensor to be identified and replaced before it fails. If a sensor goes into alarm, the control panel triggers the system that an alarm has occurred so the system can begin to respond as described above.

Finally, as shown in FIG. 4D, a final level (Layer 7) provides co-ordinates for each component (sensor, control, panel, alarm unit) installed in the system. Here, an x,y,z co-ordinate system is used. In the system, z indicates the floor of the facility on which the component is installed; while the x and y co-ordinates locate the component at a particular location on that floor with respect to a reference (0, 0, z) point. The requisite component information is automatically exported from the database for this purpose, the appropriate co-ordinates are automatically assigned, and the updated component information is then stored back in the database.

Within alarm system 10, communications are routed from a digital alarm communications transmitter (DACT) to designated servers. The DACT combines alarm reporting, system test, and system programming capabilities, and these are provided without use of onsite personnel. Signal routing is based upon message type. The vast majority of such messages fall into either an "alarm", "supervisory", or "trouble" category. In addition to conventional messages sent through the communications channel, maintenance messages (e.g., faulty sensor) can also be sent. These messages are routed to an automatic signal dispatcher 18, 20 and do not require end user involvement.

Figure 5:
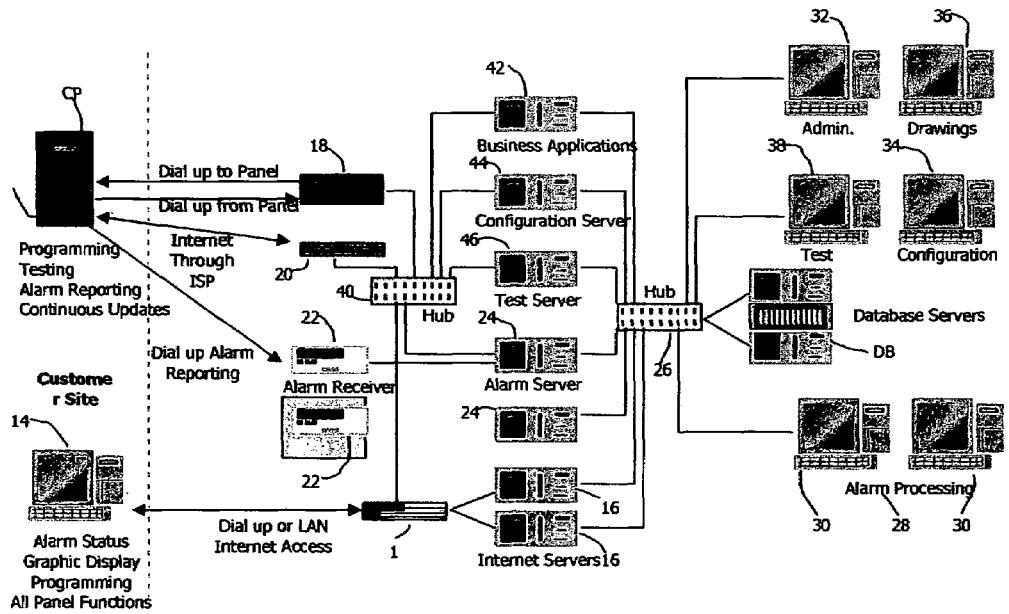
FIG. 5 is a block diagram of a reporting system of the present invention.

Referring to FIG. 5, the DACT is installed in a control panel CP for the system. As shown in FIGS. 4B-4E, panel CP is installed on site, and all the sensors P1-P13 in the system connect to the panel; either directly, or through a loop L1, L2 configuration as known to those skilled in the art and as previously described. A workstation 14 is also located on site. It will be understood that in large systems there may be multiple DACT's employed for redundant reporting capability.

When a sensor goes into alarm, an output from the DACT is routed through an alarm receiver 22 to an alarm server 24. As shown in FIG. 5, backups are provided for both the alarm receiver and alarm server. An output from alarm server 24 is directed through a communications hub 26 to an alarm processing station 28 which includes a primary and backup workstations 30. Both workstations 30 access the common database DB for the system to obtain pertinent information related to the site. As previously described, this includes a description of the building, its address, information about the device that triggered system 10 into alarm, the device, a past history of other alarms, special instructions regarding how responders should respond to the alarm (e.g., the presence of hazardous materials located in particular areas), etc.

In addition to the alarm processing workstations 30, other workstations 32-38 are provided for various users who perform administrative functions, testing, drawings, and system configuration. All of these workstations can be located at separate sites, and all may include backup workstations (not shown). All of these other workstations have access to common database DB through communications hub 26. Thus, all the data used in the system is common throughout the system, and the information displayed on any workstation monitor can include both text and graphics.

Figure 7:
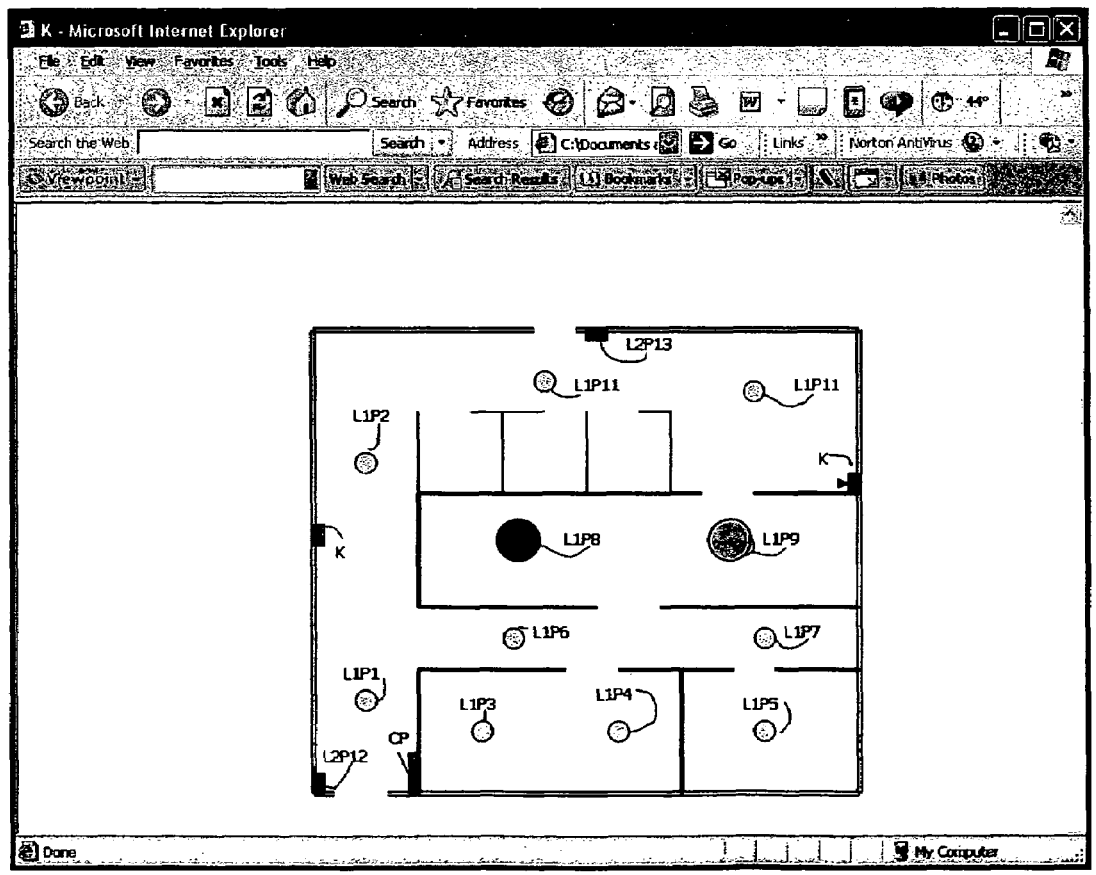

Referring to FIG. 7, an example of a graphic display is shown. In FIG. 7, the sensors fire alarm sensors P1-P11 are represented as colored circles. If everything is normal, i.e., there is no alarm condition, each sensor is represented by a circle of one size, and preferably one color. For example, the sensors are represented as small, green circles. When a sensor goes into alarm, the representation is immediately changed to highlight the sensor and its location. Here, sensor P8 is shown to have gone into alarm, and that sensor is now represented by a greatly enlarged circle whose color has changed from green to red. In addition, if a sensor is approaching its preset threshold for going into alarm, that information is graphically displayed as well. Thus, in the graphic display of FIG. 7, sensor P9 is shown as a circle larger than those sensors whose condition is normal, but smaller than the circle representing sensor P8. The color of the circle representing sensor P9 may also have changed from green to yellow, for example. Both of these indicia indicate that while sensor P9 is not yet in alarm, it is approaching that condition. Consequently, the representation shown in FIG. 7 would mean, for example, that a fire has occurred at the location of sensor P8, and is spreading in the direction of sensor P9, but has not yet reached that location.

The floor plan FP graphics shown in FIG. 7 can be displayed not only at a monitoring site, but also to each responder, whether a fire department, police, ambulance or other medical responders. As previously noted, with respect to both sensors P8 and P9, previous device data can also be displayed. Providing all of this information is critical for both protection of the people responding to an alarm, as well as determining how to put out the fire, in this example, and protect the property.

An important feature of the method of the invention thus is that it relates spatial device data with event data to determine whether other devices in an area are experiencing like changes in analog information. As previously described, all of these devices are identified in the X,Y,Z coordinate system. Further, another important feature of the invention is that no longer is there the possibility of different data being resident in different databases with the possibility that erroneous or incomplete information will be available depending upon which database is accessed. Rather, all of the information is resident in the single database DB so there is no likelihood of out-of-date, or incorrect or erroneous information being provided.

Referring again to FIG. 5, a second communications hub 40 is available for routing communications to and from control panel CP through various servers 42-46 to different workstations. As indicated in FIG. 5, it will be noted that the various servers are dedicated for the particular functions associated with the workstation to and from which communications are routed. It will be understood that the communications paths to and from panel CP, the various servers, workstations, and database DB can be through dedicated channels, or as shown with respect to the workstation 14 on-site, a local area network (LAN). As previously discussed, the internet may also be used. In FIG. 5, it will be noted that diverse connections are established between the premises being monitored and remote facilities. This has the advantage of increasing the survivability of reporting during a fire since there are now multiple access points to the system. However, although the system has multiple access points, it still functions as a single entity, routing information to the different users.

It will be understood that the various users do not need a permanent connection into the system. Rather, certain users or authorized individuals may be granted conditional access based on the occurrence, or lack of occurrence, of an event. Access may be granted only during the event and for a specified period thereafter. The user may have access to some information, but not other information, if an event has not taken place. In addition, users or authorized individuals may be defined and be granted access to the system only during an active event. The user may access the system without a password or other authorization only during the event, but is restricted to access with a password or other authorization at all other times.

The communications system shown in FIG. 5 includes an embedded unique Uniform Resource Locator (URL) link and identifier in each data transmission. A data transmission contains the parameters that describe an event, its location, and any specialized actions that may be required, as well as graphical and text data which is updated on a continuing basis until a decision is made to end the event. The URL remains active for a predetermined time after the event is ended, and then is no longer accessible through normal methods.

During system installation, control panel CP of the system is programmed. As part of the method of the invention, back-ups of images of the panel configuration are made and stored at configuration workstation 38 for recovery by maintenance personnel should a situation arise where the panel must be reconfigured. During system programming, both when the system initially goes on-line, and subsequently, an auto-synchronization protocol is carried to both upload information from database DB and download information to the database. Information entered into database DB during the design phase of the system is also utilized at this time. To simplify system programming, defaults are programmed into the control panel. This does not, however, preclude the ability of complex logic to be executed within the panel. The programming steps also include entering structured ID descriptions for the respective sensing devices. Device type and serial numbers are reviewed at all the work sites, and any mismatches, missing numbers, or duplicate numbers are identified and corrected.

Figure 6:
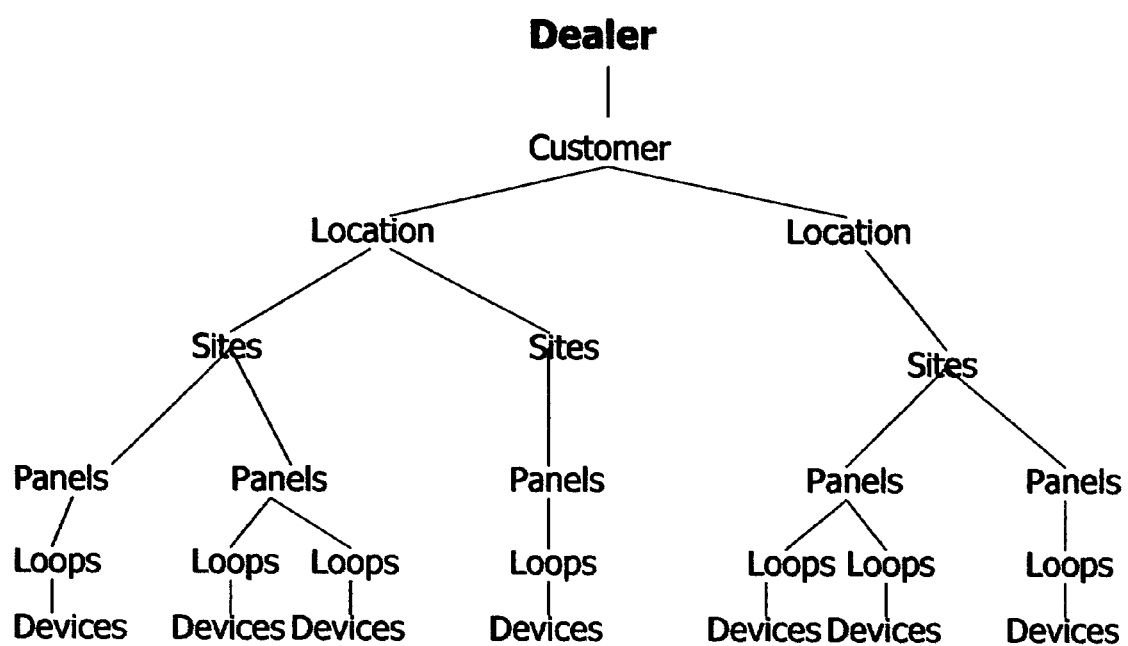
FIG. 6 illustrates the structure of a common database in which all information is available; and, FIG. 7 is a graphic display of a premises on which certain sensing devices are in various alarm conditions.

The resulting database configuration is shown in FIG. 6. Here, the database structure provides links for system installation, testing, and reporting. The structure allows for reporting for a customer by location (New York City, Philadelphia, Los Angeles), site ($10^{th}$ Avenue, First Street, Oak and Main), as well as by all locations and all sites. All information stored in the database is reusable; for example for contacting the customer, scheduling maintenance and repair, etc.

Standard information about each location or point within the facility stored in database DB includes:
point identification number
serial number
installed device type
device type
floor (z)
x,y co-ordinates
association
panel type
input and output loops
input and output zones
output characteristics
text description
alarm sensitivity
average current reading
reference reading
last alarm
last test
schedule
AI logic selection This database structure is used throughout the system. In addition to the above, panel network information is also stored in the database. This information includes panel name and serial number, information sharing status, and alarm reporting to a monitoring site.

Testing of the sensing devices is done on a periodic basis and the results are stored in database DB. Algorithms determine a sample rate of individual devices based on a rate of change in the device output and the proximity of the output to preset thresholds. Historic incident, and current data determine the validity of an alarm state of a device. This is done at the monitoring station or other remote site. This remote verification is independent of any local logic which may indicate an alarm condition. In addition, algorithms stored in database DB, or at a testing site using the information stored in the database, acts on data from each device to predict future device performance. Changes in preset levels transmitted from the monitoring site to the local device are based on calculated results. Maintenance of the system can be scheduled based upon calculation results or absolute data values.

Finally, any device in the system is programmable through a single network connection point to a remote facility. The connection point to the remote facility does not share the same network as does those devices locally. All data sent to and from the remote facility passes through a common access device.

In view of the above, it will be seen that the several objects and advantages of the present invention have been achieved and other advantageous results have been obtained.

The invention claimed is:

1. A method of integrating the design, installation, and operation of a fire alarm and security system in a facility and of monitoring the fire alarm and security system at a separate alarm processing station, the system incorporating various components including sensors and system control and communications equipment, the method comprising:

establishing a single database in which is stored information about the system, the single database is located remotel from the facility and from the alarm processing station;

laying out components for the system including the type of sensor installed at respective locations throughout the facility, interconnections between the sensors and system control equipment, and communication paths both within the system and externally, said information about the components and their interconnections and the communication paths being entered into the single database as the system is laid out; and, updating the single database with new information if the system lay out is subsequently modified, the single database retaining the previously entered system information whereby a continuous and complete record of the system is maintained in the single database for ease of use by those needing information about the system.

2. The method of claim 1 further including laying out the system in layers of information with each layer defining another aspect of the system, and the information related to each layer being entered into the single database.

3. The method of claim 2 wherein a first layer of information comprises information relating to the facility including its address, the location of nearest responders to an alarm emanating from the system, and contact information for responders and other parties to be contacted in the event of an alarm.

4. The method of claim 3 wherein a next layer of information includes floor plans for each floor in the facility and the location and routing of various services and structures for that floor.

5. The method of claim 4 wherein a next layer of information includes the placement of sensors and control and communications equipment and routings of wiring from the control equipment to the sensors.

6. The method of claim 5 wherein a next layer of information includes sensor identification, location and address information and any special information relating to an area or zone in which a sensor is located.

7. The method of claim 6 wherein a next layer of information includes input and output information for the system.

8. The method of claim 7 wherein a next layer of information includes hook-up information relating to interconnections between sensors and system control equipment.

9. The method of claim 8 wherein a next layer of information includes co-ordinate information identifying the exact location of each alarm system component in three-dimensions including on which floor of the facility a component is installed, and where on that floor.

10. The method of claim 5 further including automatically placing additional sensors in the system once a first sensor of the same type is placed, automatic placement of the additional sensors being done in accordance with predefined placement requirements concerning the area of coverage of that type sensor.

11. The method of claim 10 wherein a user can change the placement of any automatically placed sensor without changing the placement of any other automatically placed sensor.

12. The method of claim 10 wherein a user can redefine the placement requirements for automatically placed sensors with the placement of sensors being automatically changed to conform to the new requirements, including the adding of new sensors or the deletion of previously placed sensors.

13. The method of claim 10 in which sensor identification and location information is automatically entered into the single database for each sensor as it is placed, and automatically changed if a sensor is moved from its original location.

14. The method of claim 13 in which a sensor address is automatically assigned to the sensor when the sensor is placed, the addresses of all the sensors being appropriately changed as sensors are added to, or deleted from, the system.

15. The method of claim 13 in which information relating to a sensor placed in a special area is stored together with the other information about the sensor so, if the sensors goes into alarm, the information is relayed to responders.

16. The method of claim 13 further including establishing an order in which responders to an alarm are to be contacted, the order varying depending upon the type of alarm, and the type of information to be provided to each responder.

17. The method of claim 16 further including establishing a list of non-responders to be contacted in the event of an alarm and the type of information to be provided to each non-responder.

18. The method of claim 1 further including monitoring operation of the alarm system after it is installed and providing pertinent information to responders to an alarm condition occurring at the facility, all of the information relating to the system design and layout, and information provided to responders being maintained in the single database.

19. The method of claim 18 for including relating spatial sensor data with alarm data to determine if other sensors in the same area are experiencing similar changes to those of a sensor which has gone into alarm and providing that information to responders and other users of the system.

20. A method of integrating the design, installation, and operation of a fire alarm and security system in a facility and of monitoring the fire alarm and security system at a separate alarm processing station, the system utilizing at least one type of alarm sensor and alarm system control and communications equipment, the method comprising: configuring the system including placing system components throughout the facility, interconnections between the components, and internal and external system communication paths;

preparing a bid for installing the system, and installing the system if the bid is accepted, preparing the bid including use of a bill of materials automatically generated during system configuration and updated if the configuration is modified; and, subsequently monitoring operation of the system and providing pertinent information to responders to an alarm condition occurring at the facility, all the information relating to the system's configuration, and information provided to responders being maintained in a single database in which is stored information about the system for ease of access and use by those involved with the system, the single database being located remotely from the facility.

21. The method of claim 20 wherein the single database is stored remotely from the alarm processing station.

22. The method of claim 20 further including generation layers of information which are stored in the single database with each layer defining another aspect of the system, with the information for each layer being related to the information for each other layer.

23. The method of claim 22 in which a first layer of information comprises information relating to the facility including its address, the location of nearest responders to an alarm emanating from the system, and contact information for responders and other parties to be contacted in the event of an alarm.

24. The method of claim 23 in which successive layers of information include:
floor plans for each floor in the facility and the location and routing of various services and structures for that floor;
the placement of sensors and control and communications equipment and routings of wiring from the control equipment to the sensors;
sensor identification, location and address information and any special information relating to an area or zone in which a sensor is located;
input and output information for the system;
hook-up information relating to interconnections between sensors and system control equipment; and,
co-ordinate information identifying the exact location of each alarm system component in three-dimensions including on which floor of the facility a component is installed, and where on that floor.

25. The method of claim 24 in which a sensor address is automatically assigned to the sensor when the sensor is placed, the addresses of all the sensors being appropriately changed as sensors are added to, or deleted from, the system.

26. The method of claim 25 further including automatically placing additional sensors in the system once a first sensor of the same type is placed, automatic placement of the additional sensors being done in accordance with pre-defined placement requirements concerning the area of coverage of that type sensor.

27. The method of claim 26 in which a user of the method can change the placement of any automatically placed sensor without changing the placement of any other automatically placed sensor.

28. The method of claim 27 in which the user can redefine the placement requirements for automatically placed sensors with the placement of sensors being changed automatically to conform to the new requirements, including the adding of new sensors and the deletion of previously placed sensors.

29. The method of claim 28 in which sensor identification and location information is automatically entered into the single database for each sensor as it is placed, and automatically changed if a sensor is moved from its original location.

30. The method of claim 24 in which information relating to a sensor placed in a special area is stored together with the other information about the sensor so, if the sensors goes into alarm, the information is relayed to responders.

31. The method of claim 24 further including establishing an order in which responders to an alarm are contacted, the order varying depending upon the type of alarm, and the type of information to be provided to each responder.

32. The method of claim 31 further including establishing a list of non-responders to be contacted in the event of an alarm and the type of information to be provided to each non-responder.

33. A method of integrating the design, installation, and operation of a fire alarm and security system in a facility and of monitoring the fire alarm and security system at a separate alarm processing station, the system incorporating various components including sensors and system control and communications equipment, the method comprising:
establishing a single database in which is stored information about the system, the single database being located remotely from the facility and from the alarm processing station;
laying out components for the system including the type of sensor installed at respective locations throughout the facility, interconnections between the sensors and system control equipment, and communication paths both within the system and externally, said information about the components and their interconnections and the communication paths being entered into the single database as the system is laid out;
updating the single database with new information if the system lay out is subsequently modified, the database retaining the previously entered system information whereby a continuous and complete record of the system is maintained in the single database for ease of use by those needing information about the system;
monitoring operation of the alarm system after it is installed and providing pertinent information to responders to an alarm condition occurring at the facility, all of the information relating to the system design and layout, and information provided to responders being maintained in the single database; and,
relating spatial sensor data with alarm data to determine if other sensors in the same area are experiencing similar changes to those of a sensor which has gone into alarm and providing that information to responders and other users of the system.

* * * * *

UNITED STATES PATENT AND TRADEMARK OFFICE
CERTIFICATE OF CORRECTION

PATENT NO. : 7,378,942 B2 Page 1 of 1
APPLICATION NO. : 11/260343
DATED : May 27, 2008
INVENTOR(S) : John E. Seeley and Mitchell Black It is certified that error appears in the above-identified patent and that said Letters Patent is hereby corrected as shown below:

Error noted in claim 1, Col. 11, Line 13
  Replace "remotel"
  with --remotely--

Signed and Sealed this

Twenty-ninth Day of July, 2008

JON W. DUDAS
*Director of the United States Patent and Trademark Office*